US006489217B1

(12) United States Patent
Kalnitsky et al.

(10) Patent No.: US 6,489,217 B1
(45) Date of Patent: Dec. 3, 2002

(54) METHOD OF FORMING AN INTEGRATED CIRCUIT ON A LOW LOSS SUBSTRATE

(75) Inventors: Alexander Kalnitsky, Portland, OR (US); Robert F. Scheer, Portland, OR (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/900,848

(22) Filed: Jul. 3, 2001

(51) Int. Cl.[7] ............................................... H01L 21/76
(52) U.S. Cl. ...................................... 438/409; 438/960
(58) Field of Search .......................... 438/311, 409, 438/455, 604, 606, 612, 613, 672, 675, 700, 960

(56) References Cited

U.S. PATENT DOCUMENTS 6,143,629 A * 11/2000 Sato .......................... 438/455
6,143,929 A * 11/2000 Sato .......................... 438/455
6,376,285 B1 * 4/2002 Joyner et al. ............... 438/149
6,376,859 B1 * 4/2002 Swanson et al. ............. 257/49

* cited by examiner

*Primary Examiner*—Viet Q. Nguyen
*Assistant Examiner*—David Nhu
(74) *Attorney, Agent, or Firm*—Blakely, Sokoloff, Taylor & Zafman LLP

(57) ABSTRACT

A method for manufacturing an integrated circuit structure is disclosed. The method includes providing a layer of porous silicon, and epitaxially growing a high resistivity layer on the layer of porous silicon. Devices are then formed on the high resistivity layer to produce the integrated circuit structure. The integrated circuit structure is attached to a silica substrate, such that the silica substrate is coupled to the devices. Further, surface contacts are provided on the structure. The layer of porous silicon is then removed.

29 Claims, 10 Drawing Sheets

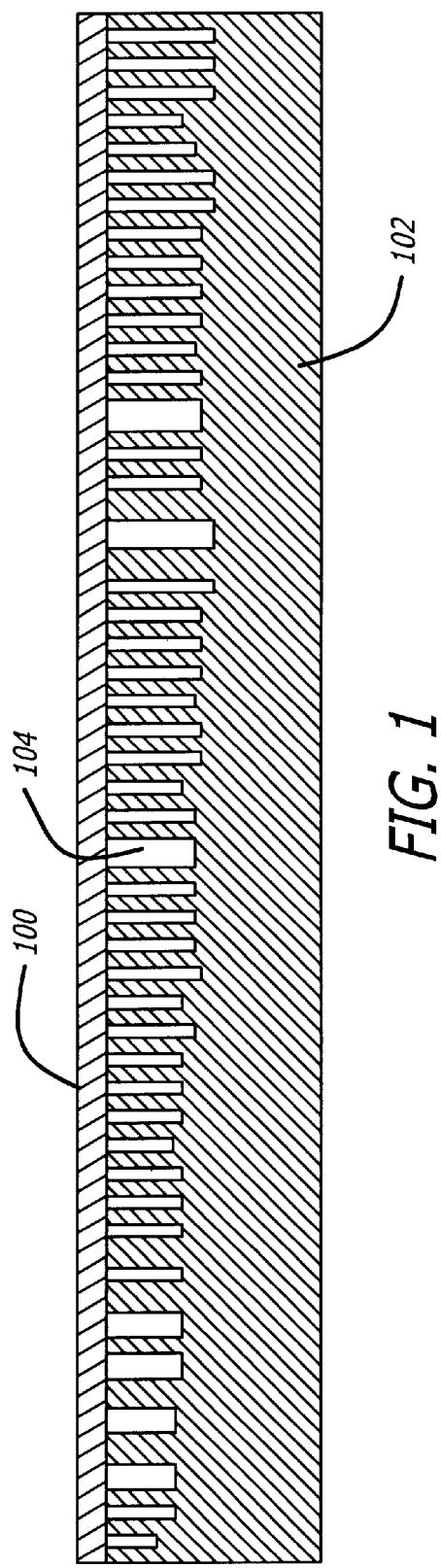
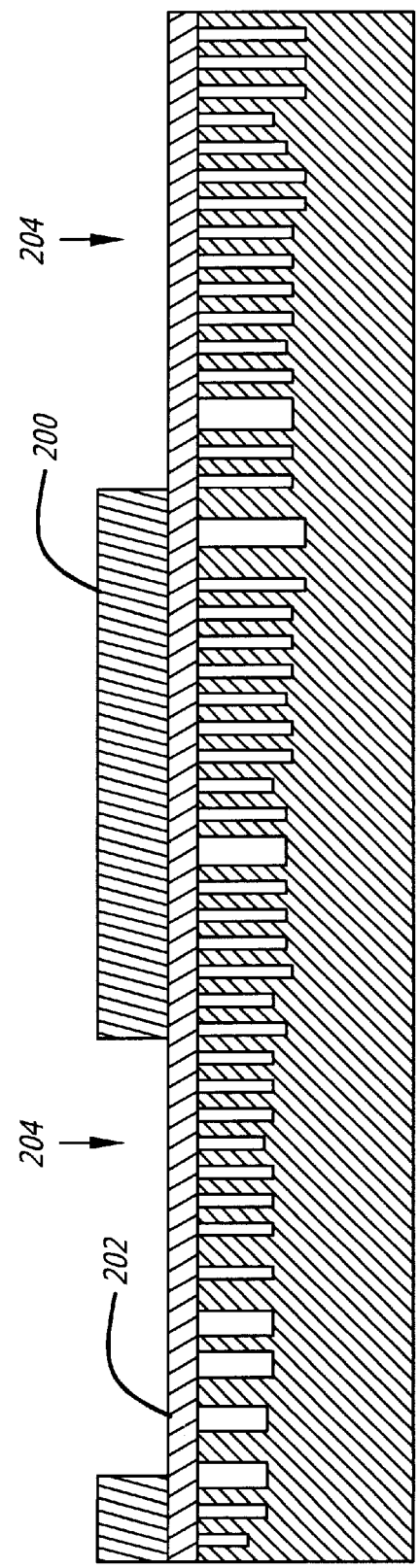

METHOD OF FORMING AN INTEGRATED CIRCUIT ON A LOW LOSS SUBSTRATE

BACKGROUND

1. Field of the Invention

The present invention relates to an integrated circuit, and more particularly, to formation of such a circuit on a low loss substrate.

2. Prior Art

Semiconductor devices in the form of integrated circuits are important in telecommunications systems involving a broad spectrum of different circuits. These circuits may have high frequency capabilities. High frequency telecommunications circuits typically involve the use of inductors to either tune a circuit to a particular desired frequency, to perform critical circuit functions such as maintaining a critical current flow, or to filter and eliminate undesired electrical noise from desired signals. Since the use of discrete inductors that are separate from the integrated circuit may give rise to implementation problems, the high frequency circuit design has been moving in the direction of integrating as many of these needed inductors as possible into the semiconductor device itself.

The quality factor (Q) of an inductive circuit is a figure of merit that relates the energy stored to the energy dissipated or lost. High Q inductor circuits (a Q of 10 or greater) conserve sufficient energy to allow an appropriate inductive response. Alternately, low Q inductor circuits (a Q of 3 or less) lose a sufficient portion of the energy applied causing them to perform poorly as inductive elements.

An example of a typical integrated circuit, used in many current communications microchips, has a highly conductive substrate and a moderately resistive epitaxial (EPI) layer grown on the substrate. However, this design may not be conducive for supporting a high Q inductor. An integrated inductor formed over the EPI layer may induce eddy currents into the highly conductive substrate thereby incurring a large energy loss. To be energy efficient and therefore low loss, the integrated inductor would have to be formed over a highly resistive substrate.

SUMMARY

The present invention, in one aspect, describes a method for manufacturing an integrated circuit structure. The method includes providing a layer of porous silicon, and epitaxially growing a high resistivity layer on the layer of porous silicon. Devices are then formed on the high resistivity layer to produce the integrated circuit structure. The integrated circuit structure is attached to a silica substrate, such that the silica substrate is coupled to the devices. Further, surface contacts are provided on the structure. The layer of porous silicon is then removed.

In another aspect, the present invention describes an integrated structure. The structure includes a layer of porous silicon, a high resistivity layer, a plurality of circuit devices, a silica substrate, and surface contacts. The high resistivity layer is epitaxially grown on the layer of porous silicon. The plurality of circuit devices is formed on the high resistivity layer to produce the integrated circuit structure. The silica substrate is attached to the integrated circuit structure, such that the silica substrate is coupled to the circuit devices. Surface contacts provide connections to the circuit devices.

BRIEF DESCRIPTION OF THE DRAWINGS

FIG. 1 illustrates one embodiment of providing a low loss surface for forming an integrated circuit.

FIG. 2 shows a photomask provided over selected regions of an epitaxial layer to form buried layers.

DETAILED DESCRIPTION

Figure 3:
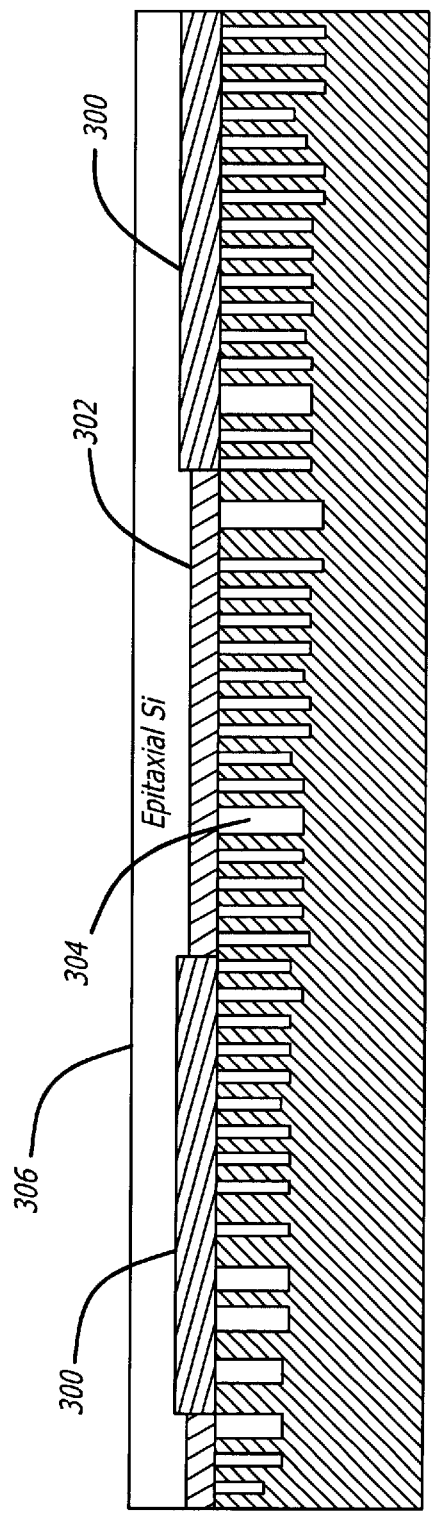
FIG. 3 shows an embodiment of the formed buried layers.

In recognition of the above-stated problems with prior designs of integrated circuits, the present invention describes embodiments for forming an integrated circuit on a high resistivity/low loss substrate. In one embodiment, a low loss substrate is configured to provide a suitable platform on which to manufacture RF circuits with high Q integrated inductors. In another embodiment, active devices are formed on a high resistivity epitaxial layer. Moreover, the epitaxial layer is formed on a low resistivity wafer, which may include a layer of porous silicon. Other structures and layers, such as buried layers, deep and shallow trench isolation, heat pipes and interconnections, may be formed and deposited on the epitaxial layer. The structured wafer may then be glued to a fused silica or silica glass substrate. Further, the low resistivity wafer substrate may be removed, and additional layers of interconnect, dielectric, and metal contact may be formed. Consequently for purposes of illustration and not for purposes of limitation, the exemplary embodiments of the invention are described in a manner consistent with such use, though clearly the invention is not so limited.

FIG. 1 illustrates one embodiment of providing a low loss surface for forming an integrated circuit. A method similar to the one described in U.S. Pat. No. 6,143,629 (e.g. epitaxial layer transfer process) may be utilized for providing a high resistivity epitaxial layer 100 on a silicon substrate 102. In the illustrated embodiment, a base substrate 102 having a porous silicon layer 104 may be prepared, e.g., by anodizing at least one-side surface of a silicon substrate 102 or the whole silicon substrate 102. In an alternative embodiment, the porous silicon layer 104 may be treated to seal surface pores present at the surface. The porous silicon layer 104 whose surface pores have been sealed in this way may be subjected to heat treatment before the epitaxial growth described below.

Porous silicon typically has, like a sponge, pores of a few nanometers to tens of nanometers in diameter inside the silicon crystal. Thus, upon thermal oxidation in an atmosphere containing oxygen, the surface of porous silicon and its interior are simultaneously oxidized by the action of the oxygen. The controlling of oxide film thickness relies on the thickness of a porous layer rather than the time of oxidation, and hence it is possible to form a silicon oxide film that is tens to hundreds of times as thick as that formed by oxidation of bulk silicon.

A non-porous single-crystal layer 100 may then be formed on the surface of the porous silicon layer 104. In one embodiment, the material constituting this non-porous single-crystal layer 100 may be silicon deposited by epitaxial growth. The epitaxial layer 100 may include other material from Group IV (of the periodic chart) such as SiGe or SiC, or a compound semiconductor as typified by GaAs, GaAsAl, InP or GaN.

In some embodiments, the porous silicon acts as a stress-compliant material and may relax the stress caused by lattice mismatch. Moreover, it may lower the stacking fault density of the non-porous single-crystal silicon layer 102, and hence may also lower the crystalline defect density of the epitaxially grown layer. So long as the porous layer 104 has been kept from structural changes and coarsening, pore division and so forth, the effect of relaxing stress may be preserved.

In other embodiments, the porous layer 104 may have a large amount of voids formed internally thereof. As a result, the density of the layer 104 may be reduced to half or lower. Furthermore, the surface area per unit volume (specific surface area) may be substantially increased, and therefore its chemical etching rate is accelerated as compared to the etching rate of a conventional non-porous monocrystalline layer.

FIG. 2 shows a mask 200 provided over the epitaxial layer 202 to form buried layers within selected regions of the epitaxial layer 202. In the illustrated embodiment, ion implant 204 is used to produce the buried layers. In another embodiment, the buried layers may be formed by diffusion.

An embodiment of the formed buried layers 300 is shown in FIG. 3. The buried layers 300 are shown to have penetrated deeply into the epitaxial layer 302 such that the buried layers 300 terminate in the porous silicon layer 304. However, in other embodiments, the buried layers 300 may be formed by partially penetrating the high resistivity epitaxial layer 302. Epitaxial silicon 306 may then be deposited over the buried layers 300 and unexposed areas of the high resistivity epitaxial layer 302. In one embodiment, the layer 306 formed by epitaxial silicon may include low resistivity silicon.

Figure 4:
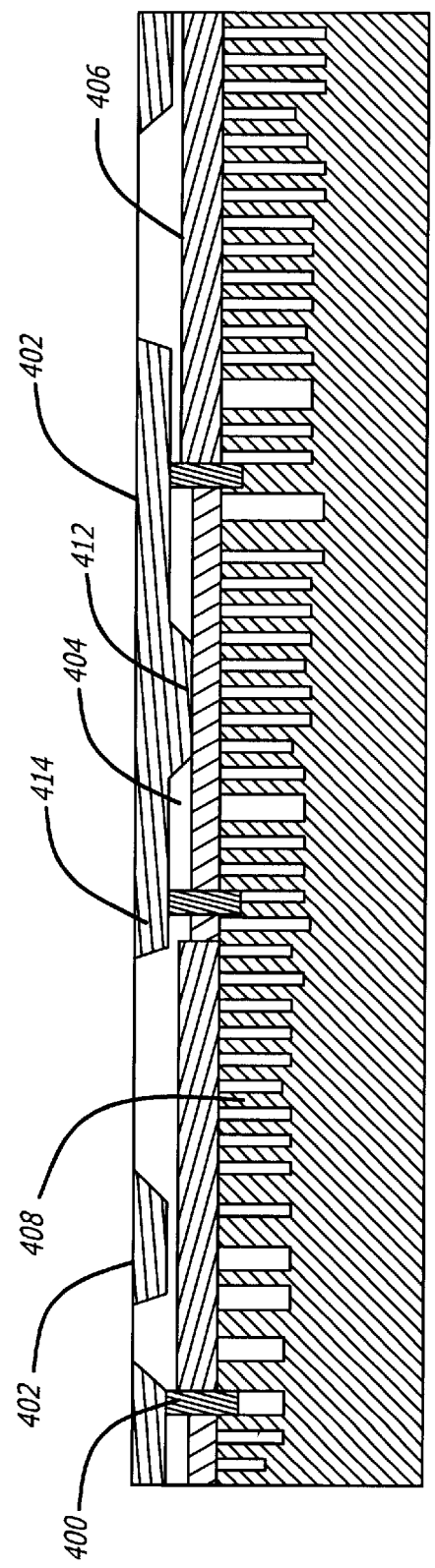
FIG. 4 shows deep and shallow trench isolations formed in the epitaxial silicon layer.

Referring to FIG. 4, deep 400 and shallow trench 402 isolations are formed in the epitaxial silicon layer 404. Hence in the illustrated embodiment, the deep trench isolation regions 400 provide isolation among buried layers 406 and deep collector implants (not shown). The deep trench isolation regions 400 may be etched deep enough that the regions 400 terminate in the porous layer 408. The isolated regions of the buried layers 406 and deep collector implants may be used later as part of the electrical interconnect and heat pipe. In an alternative embodiment (shown in FIG. 4), the epitaxial silicon layer 404 is substantially removed from the area 412 where high Q inductors may be formed prior to shallow trench fill.

In one embodiment, the trench 414 may be filled with a high resistivity material, such as an epitaxy layer. Accordingly, the resistivity between the metal windings of the inductor and the semiconductor substrate may be increased, and the substrate effects may be substantially reduced. The area of the trench 414 may be defined to be larger than that of the to-be-formed inductor. The dopant concentration of the silicon substrate or the epitaxy layer may be lower than that of the semiconductor substrate by several orders of magnitude, depending on various situations, so as to increase the resistivity thereof by the same magnitude to several KΩ-cm.

Figure 5:
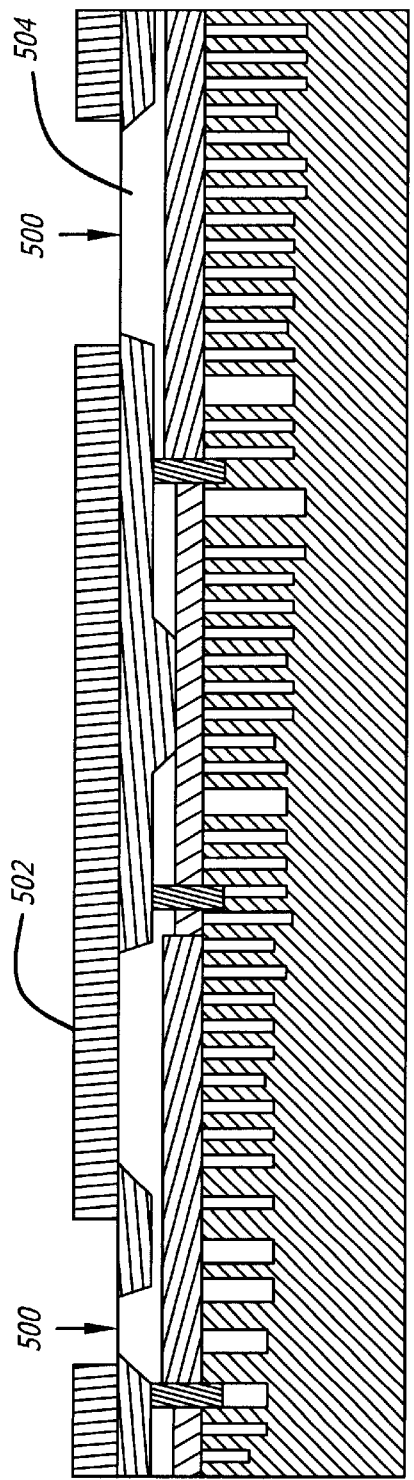
FIG. 5 shows sinker and vertical interconnect implantation.
Figure 6:
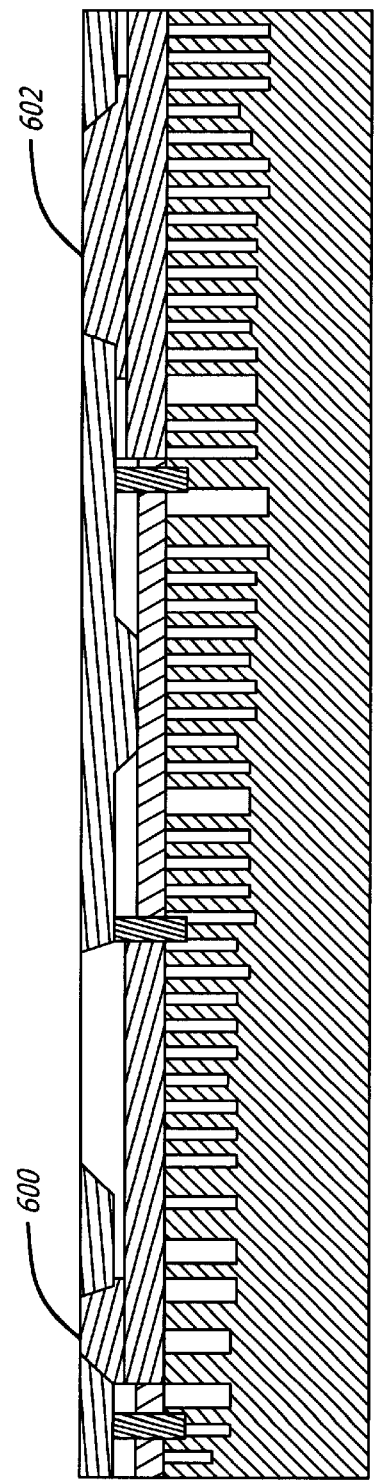
FIG. 6 shows sinker and vertical interconnect drive.

FIGS. 5 and 6 show sinker 600 and vertical interconnect 602 implant and drive. A photomask 502 is provided to implant 500 only selected areas of the epitaxial silicon layer 504 to form the sinker 600 and/or interconnect 602. In some embodiments, the sinker 600 may form a transistor collector. In other embodiments, the sinker 600 may perform similar function as the vertical interconnect 602.

Figure 7:
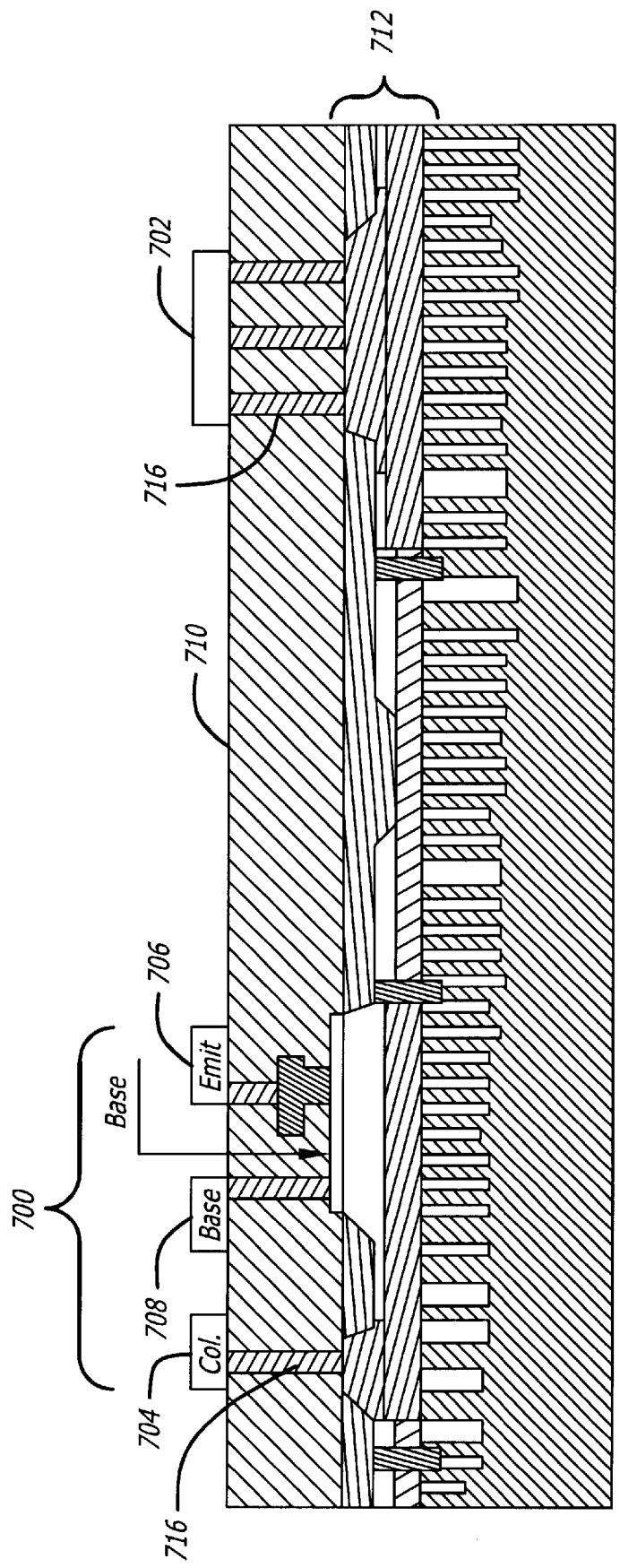
FIG. 7 illustrates formation of integrated devices on the sinker, the isolation trenches, and the epitaxial silicon layer.

FIG. 7 illustrates formation of integrated devices 700, 702 on the sinker, the isolation trenches, and the epitaxial silicon layer. In the illustrated embodiment, the integrated devices 700, 702 include a bipolar transistor 700 having collector 704, emitter 706, and base 708 terminals. The devices 700, 702 also include an inductive element 702. In other embodiments, the integrated devices may include CMOS or other related elements.

A pre-metal dielectric (PMD) layer 710 may then be deposited as shown. This PMD layer 710 is typically disposed between the polysilicon gate/interconnect level 712 and the lowest metal layer (e.g. metal-1 layer). Openings 716 in the PMD layer 710 are referred to as contact holes. These holes 716 provide openings for heat pipes and vertical interconnects, which provide connections between the contacts 702–708 and the integrated devices 700, 702 formed in the PMD layer.

Figure 8:
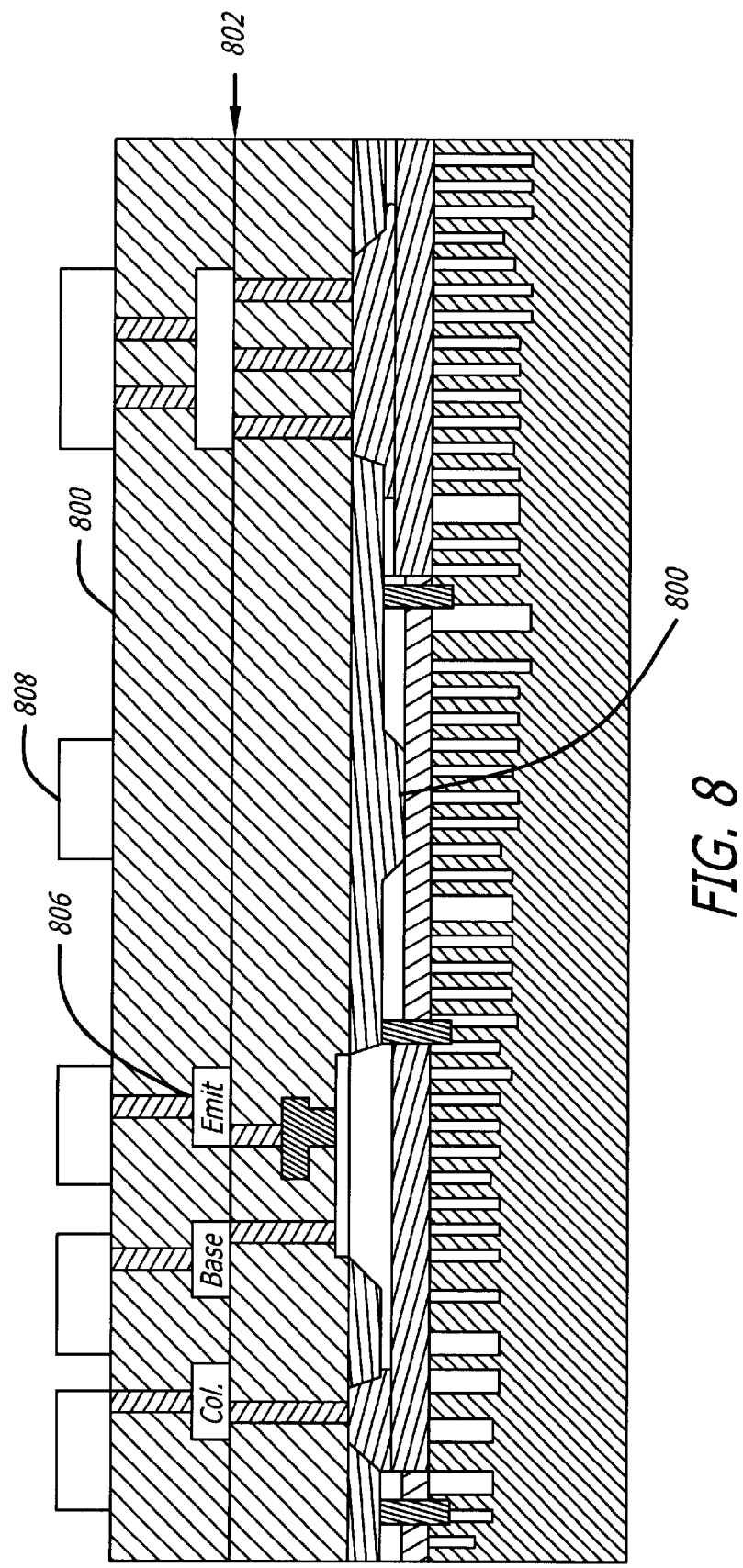
FIG. 8 shows formation of interlevel dielectric (ILD) layer.

Formation of interlevel dielectric (ILD) layer 800 according to an embodiment of the present invention is shown in FIG. 8. In the illustrated embodiment, the ILD layer 800 is disposed between metal levels, metal-1 (802) and metal-2 (804). Other ILD layers may be disposed between subsequent metal levels. Openings 806 in the ILD layer 800 are referred to as vias. These openings 806 allow contacts to be made between metal-1 (802) and metal-2 (804). Furthermore, an inductor 808 is shown formed above where the epitaxial silicon has been completely etched away in the shallow trench isolation region 810. In an alternative embodiment, the ILD layer 800 may be passivated.

Figure 9:
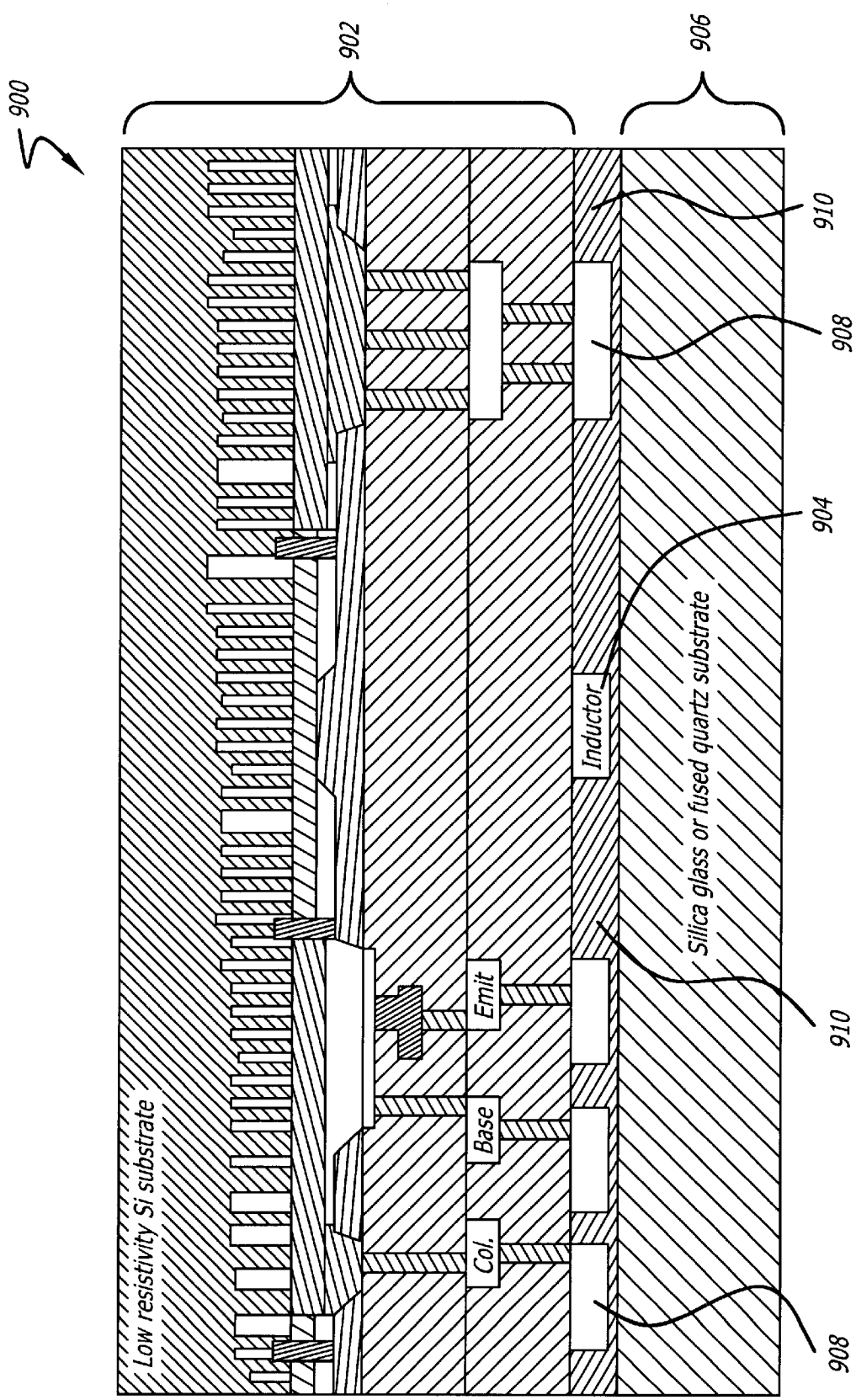
FIG. 9 shows a structure formed by attaching a processed water to a fused silica or silica glass substrate according to an embodiment of the present invention.

As described above, the semiconductor wafer 902 has been partially processed with several layers of electrical interconnect, including the inductor metal 904. Thus, a structure 900 (see FIG. 9) may be formed by attaching the processed wafer 902 to a fused silica or silica glass substrate 906. The attachment process may include bonding the processed wafer 902 to the substrate 906 using a wafer stacking technique described by K. W. Lee et al at the IEDM-2000 conference, and entitled "Three-Dimensional Shared Memory Fabricated Using Wafer Stacking Technology."

The wafer stacking technique involves temporarily bonding the wafer 902 and the substrate 906 in a face-to-face disposition using micro-bumps 908. After the temporary bonding using the micro-bumps, the liquid epoxy adhesive may be injected into the gap 910 between the wafer 902 and the substrate 906 in a vacuum chamber to enhance the bonding capability of the wafer 902 and the substrate 906.

Figure 10:
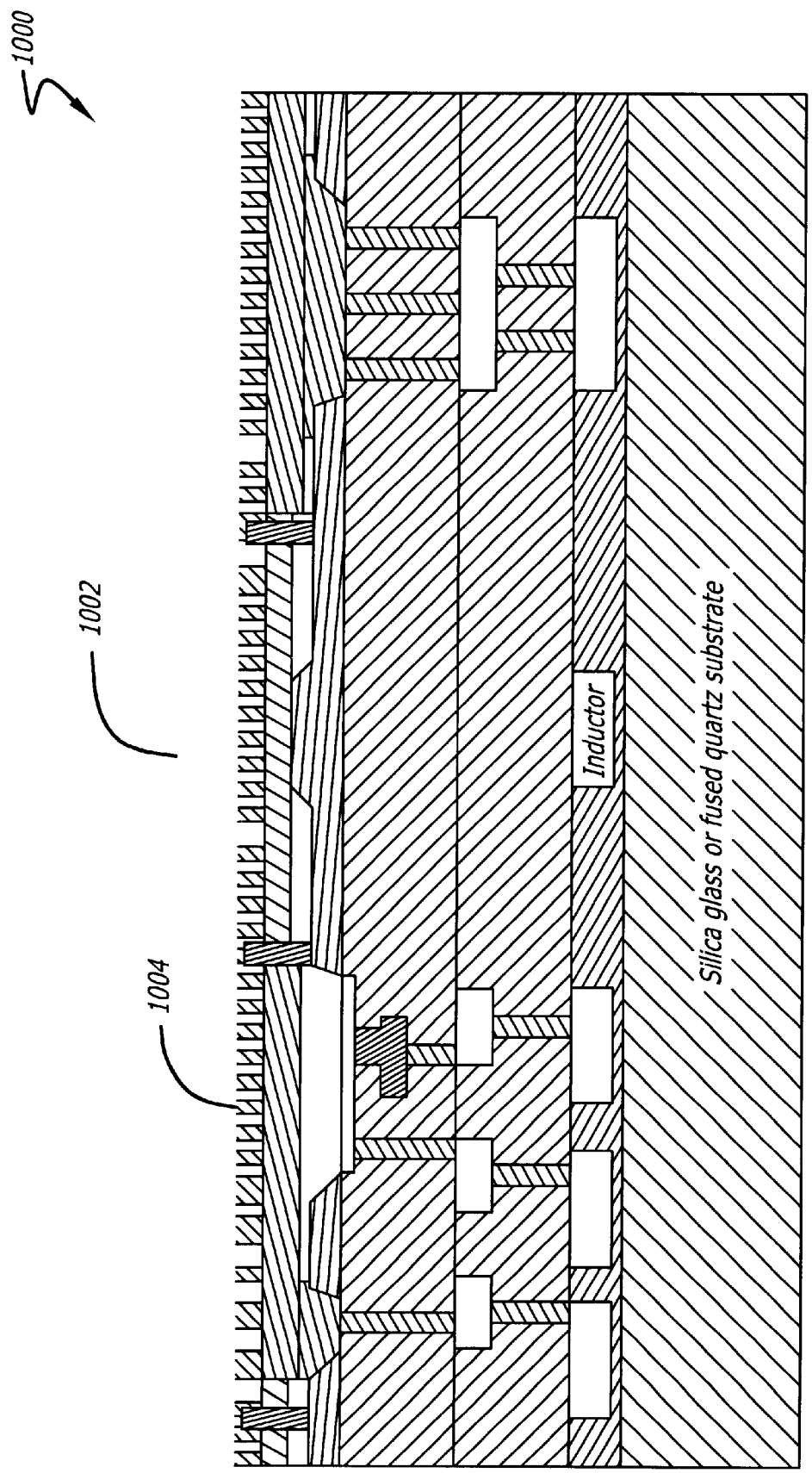
FIG. 10 illustrates low resistivity handle wafer removed or thinned from the epitaxial layer.

In the illustrated embodiment of FIG. 10, the low resistivity handle wafer 1002 (e.g. the non-porous region) is removed or thinned from the epitaxial layer. The non-porous region 1002 of the structure 1000 may be removed by mechanical grinding, chemical mechanical polishing (CMP), and/or etching to have the porous region 1004 exposed.

Figure 11:
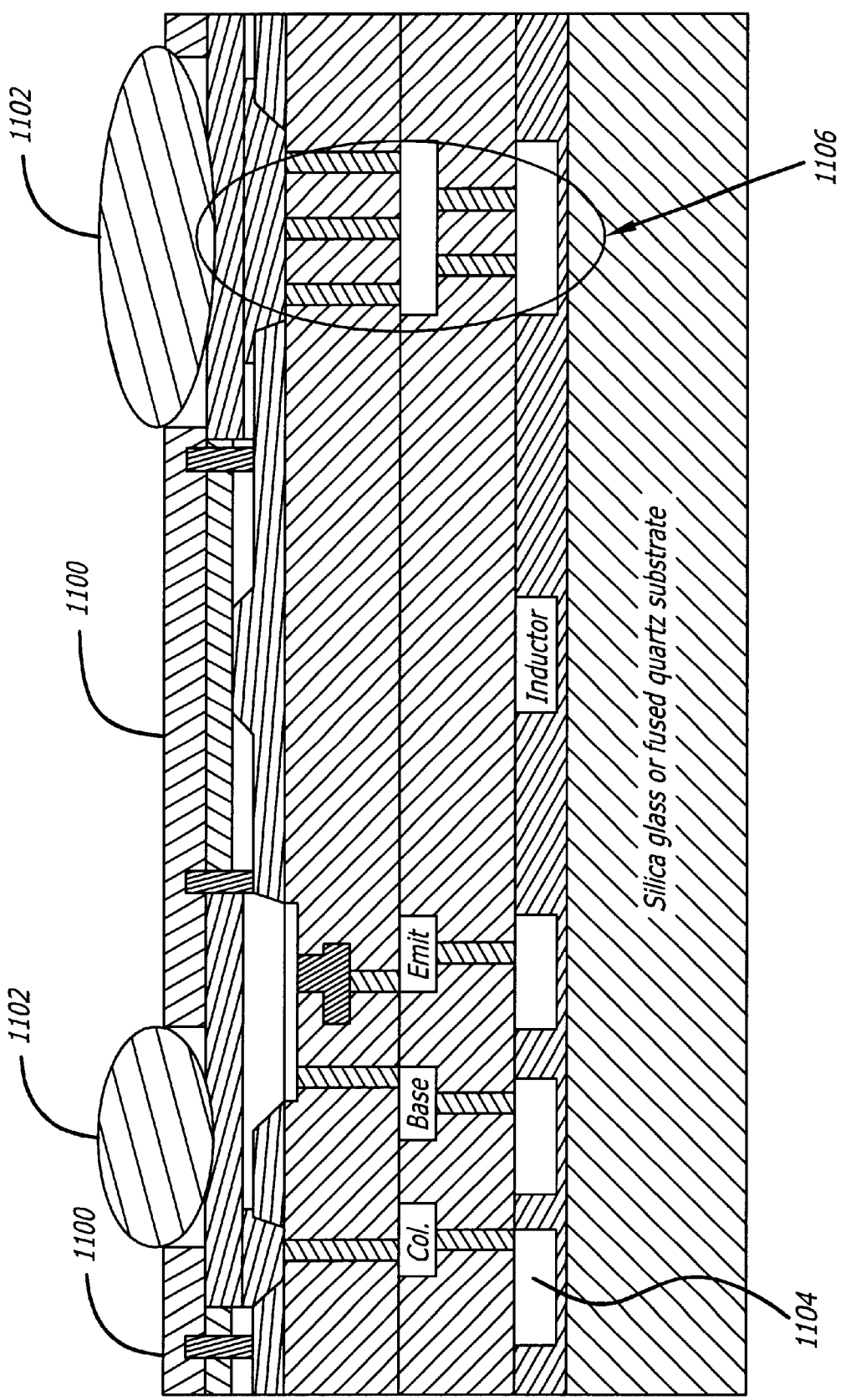
FIG. 11 shows a remaining low resistivity porous silicon layer polished or etched away.

Referring to FIG. 11, the remaining low resistivity porous silicon layer may be polished or etched away. Moreover, a layer of glass 1100 may be optionally deposited to define additional levels of interconnect. The barrier metal may then be deposited to prepare the surface for solder ball deposition. The solder balls 1102 are deposited to provide direct contact to the collector 1104. The solder balls 1102 may also provide connections to the underlying metal interconnect and heat pipe through vias 1106.

Figure 12:
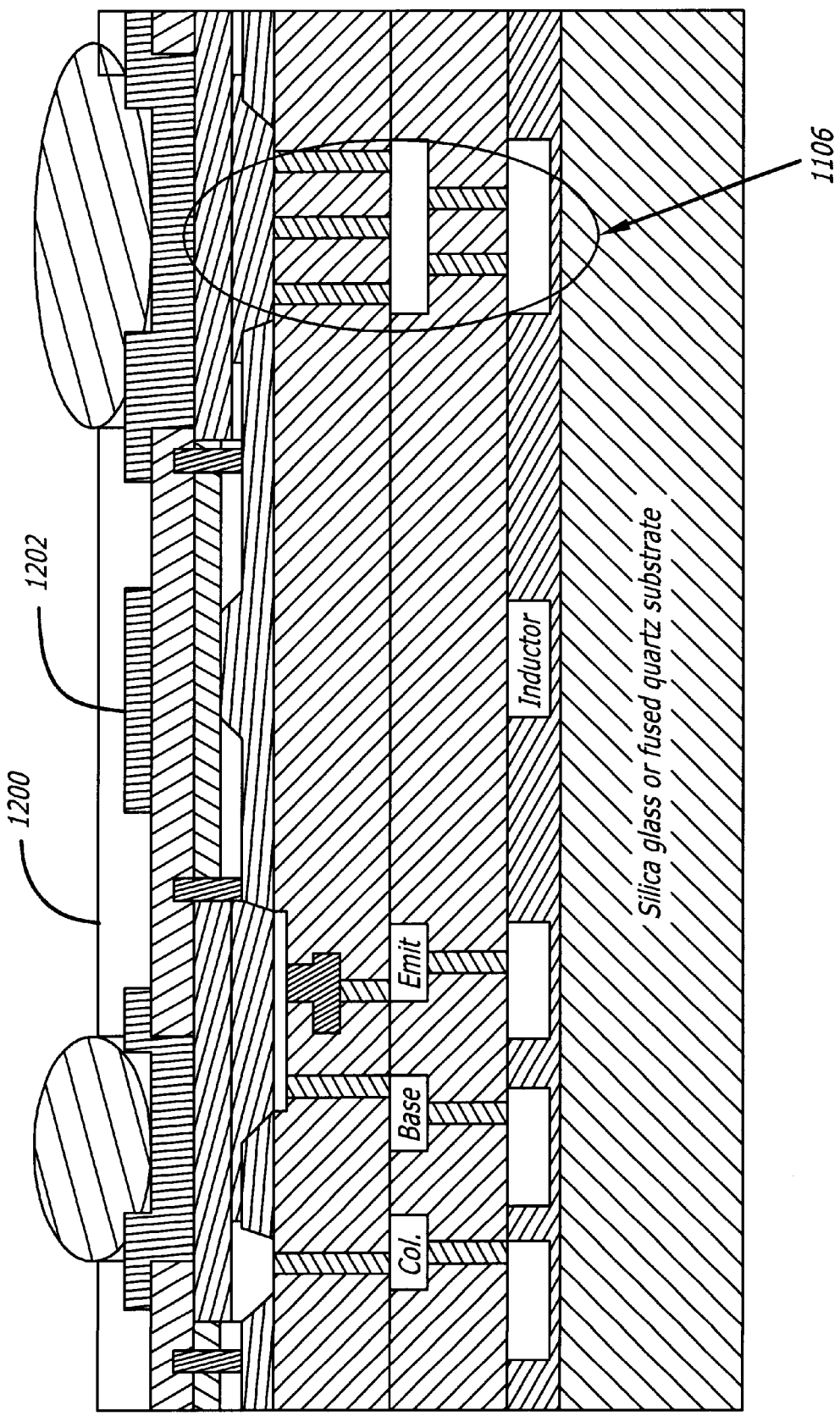
FIG. 12 shows additional layers of dielectric and metallization.
Figure 13:
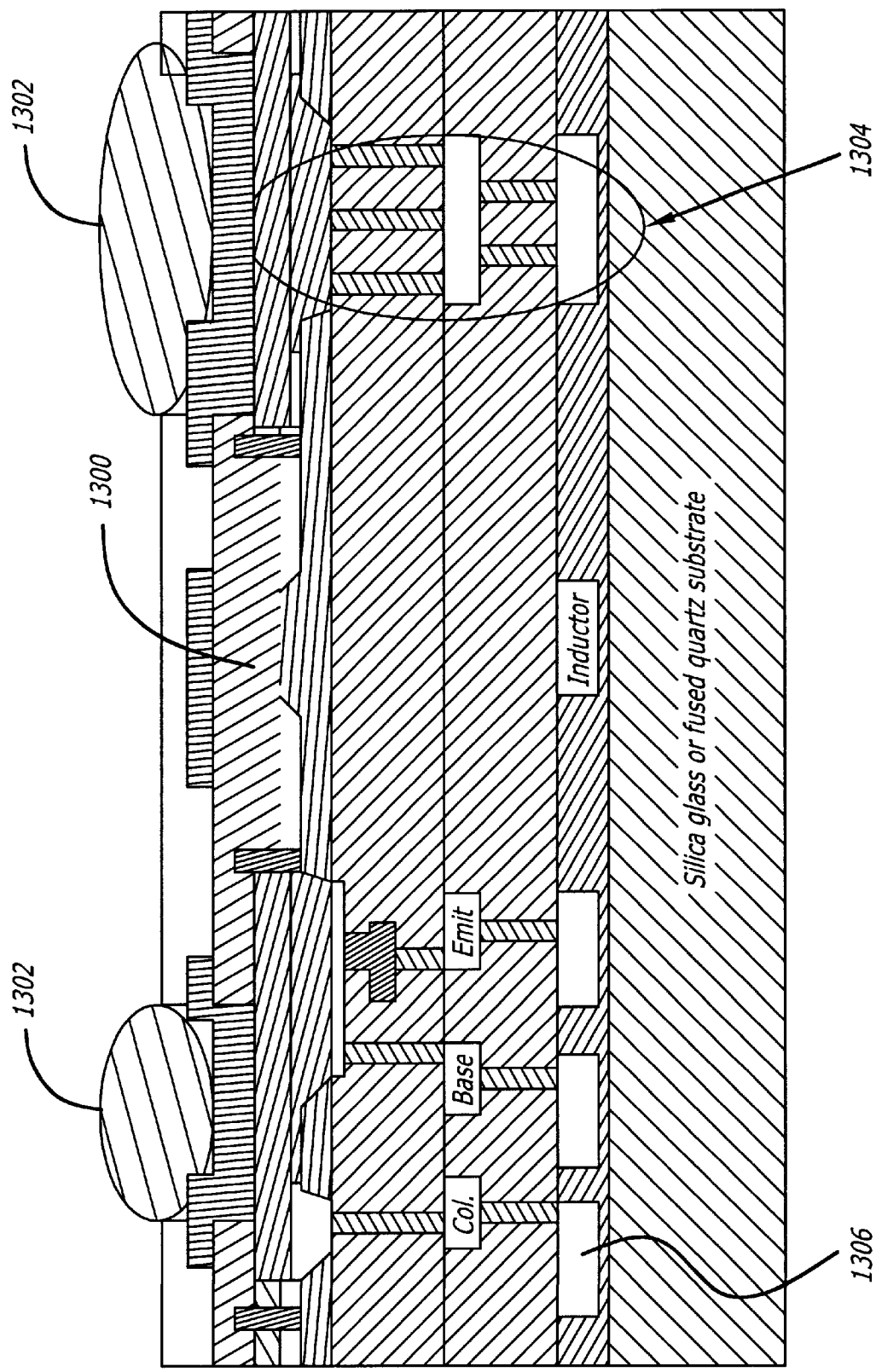
FIG. 13 illustrates selective removal of remaining epitaxial silicon prior to dielectric deposition and additional metallization layers.

As shown in FIG. 12, additional layers of dielectric 1200 and metallization 1202 may be optionally provided. Further, in FIG. 13, the remaining epitaxial silicon 1300 may be selectively removed prior to dielectric deposition 1200 and additional metallization layers 1202. This may provide substantial increase in the inductor quality factor (Q). The solder bumps 1302 may be formed over the through-via structures (bond pads) 1304 and over selected collectors 1306 of NPN devices with relatively high power dissipation. This may allow for effective cooling of the device.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the system and method may be practiced without some of these specific details. For example, forming additional layers of dielectric and metallization (FIGS. 12 and 13) may be omitted. In other instances, well-known structures and functions were not described in elaborate detail in order to avoid obscuring the subject matter of the present invention. Accordingly, the scope and spirit of the invention should be judged in terms of the claims which follow.

What is claimed is:

1. A method of manufacturing an integrated circuit structure, comprising:
   providing a layer of porous silicon;
   epitaxially growing a high resistivity layer on said layer of porous silicon;
   forming devices on said high resistivity layer to produce the integrated circuit structure, wherein said forming devices includes forming buried layers within selected regions of said high resistivity layer;
   attaching the integrated circuit structure to a silica substrate, such that the silica substrate is coupled to said devices;
   providing surface contacts; and
   removing said layer of porous silicon.

2. The method of claim 1, wherein said forming buried layers includes ion-implanting layers into said selected regions of said high resitivity layer.

3. The method of claim 1, wherein said forming devices includes depositing epitaxial silicon over said buried layers and said high resistivity layer.

4. The method of claim 1, wherein said forming devices includes forming deep isolation trenches.

5. The method of claim 4, wherein said deep isolation trenches provide isolation among said buried layers.

6. A method of manufacturing an integrated circuit structure, comprising:
   providing a layer of porous silicon;
   epitaxially growing a high resistivity layer on said layer of porous silicon;
   forming devices on said high resistivity layer to produce the integrated circuit structure, wherein said forming devices includes depositing epitaxial silicon over buried layers and said high resistivity layer, and forming shallow isolation trenches in said epitaxial silicon;
   attaching the integrated circuit structure to a silica substrate, such that the silica substrate is coupled to said devices;
   providing surface contacts; and
   removing said layer of porous silicon.

7. The method of claim 6, wherein said forming shallow isolation trenches includes etching shallow trenches in said epitaxial silicon.

8. A method of manufacturing an integrated circuit structure, comprising:
   providing a layer of porous silicon;
   epitaxially growing a high resistivity layer on said layer of porous silicon;
   forming devices on said high resistivity layer to produce the integrated circuit structure, wherein said forming devices includes configuring devices to form high quality factor (Q) inductor;
   attaching the integrated circuit structure to a silica substrate, such that the silica substrate is coupled to said devices;
   providing surface contacts; and
   removing said layer of porous silicon.

9. The method of claim 8, wherein said forming devices includes depositing epitaxial silicon over said buried layers and said high resistivity layer, and forming shallow isolation trenches in said epitaxial silicon.

10. The method of claim 9, wherein said forming high quality factor (Q) inductor includes substantially removing said epitaxial silicon from areas in said shallow isolation trenches where the inductor is to be formed.

11. The method of claim 9, wherein said isolation trenches are filled with a high resistivity epitaxy layer.

12. A method of manufacturing an integrated circuit structure, comprising:
   providing a layer of porous silicon;
   epitaxially growing a high resistivity layer on said layer of porous silicon;
   forming devices on said high resistivity layer to produce the integrated circuit structure, wherein said forming devices includes forming deep collector implants within selected regions of said high resistivity layer;
   attaching the integrated circuit structure to a silica substrate, such that the silica substrate is coupled to said devices;
   providing surface contacts; and
   removing said layer of porous silicon.

13. A method of manufacturing an integrated circuit structure, comprising:
   providing a layer of porous silicon;
   epitaxially growing a high resistivity layer on said layer of porous silicon;
   forming devices on said high resistivity layer to produce the integrated circuit structure, wherein said forming devices includes forming electrical interconnects and heat pipes within selected regions of said high resistivity layer;
   attaching the integrated circuit structure to a silica substrate, such that the silica substrate is coupled to said devices;

providing surface contacts; and removing said layer of porous silicon.

14. A method of manufacturing an integrated circuit structure, comprising:

providing a layer of porous silicon;

epitaxially growing a high resistivity layer on said layer of porous silicon;

forming devices on said high resistivity layer to produce the integrated circuit structure, wherein said forming devices includes implanting sinker and vertical interconnect;

attaching the integrated circuit structure to a silica substrate, such that the silica substrate is coupled to said devices;

providing surface contacts; and removing said layer of porous silicon.

15. The method of claim 14, wherein said forming devices includes driving said sinker and vertical interconnect.

16. The method of claim 15, wherein said sinker is configured to form a transistor collector.

17. A method of manufacturing an integrated circuit structure, comprising:

providing a layer of porous silicon;

epitaxially growing a high resistivity layer on said layer of porous silicon;

forming devices on said high resistivity layer to produce the integrated circuit structure, wherein said forming devices includes depositing a pre-metal dielectric (PMD) layer;

attaching the integrated circuit structure to a silica substrate, such that the silica substrate is coupled to said devices;

providing surface contacts; and removing said layer of porous silicon.

18. The method of claim 17, further comprising:

forming openings in the pre-metal dielectric (PMD) layer.

19. The method of claim 18, further comprising:

forming electrical interconnects and heat pipes within selected regions of said high resistivity layer to provide connection between said devices and said surface contacts.

20. The method of claim 19, wherein said openings provide contact holes for said electrical interconnects and heat pipes.

21. The method of claim 17, further comprising:

coupling an interlevel dielectric (ILD) layer to said pre-metal dielectric (PMD) layer.

22. The method of claim 21, further comprising:

forming openings in the interlevel dielectric (ILD) layer to provide connection between said devices and said surface contacts.

23. The method of claim 21, further comprising:

forming an inductor metal on said interlevel dielectric (ILD) layer.

24. A method of manufacturing an integrated circuit structure, comprising:

providing a layer of porous silicon;

epitaxially growing a high resistivity layer on said layer of porous silicon;

forming devices on said high resistivity layer to produce the integrated circuit structure;

attaching the integrated circuit structure to a silica substrate, such that the silica substrate is coupled to said devices, wherein said attaching includes bonding the structure to the silica substrate in a face-to-face disposition;

providing surface contacts; and removing said layer of porous silicon.

25. The method of claim 24, wherein said bonding includes using micro-bumps to attach the structure to the substrate.

26. The method of claim 25, further comprising:

injecting liquid epoxy adhesive in a gap between the structure and the substrate.

27. The method of claim 26, wherein said injecting is performed in a vacuum chamber to enhance bonding capability.

28. A method of manufacturing an integrated circuit structure, comprising:

providing a layer of porous silicon;

epitaxially growing a high resistivity layer on said layer of porous silicon;

forming devices on said high resistivity layer to produce the integrated circuit structure, wherein said providing surface contacts includes depositing a barrier metal on the structure;

attaching the integrated circuit structure to a silica substrate, such that the silica substrate is coupled to said devices;

providing surface contacts; and removing said layer of porous silicon.

29. The method of claim 28, further comprising:

depositing solder balls on the barrier metal.

* * * * *